United States Patent
Myodo et al.

(10) Patent No.: US 11,315,846 B2
(45) Date of Patent: Apr. 26, 2022

(54) SEMICONDUCTOR DEVICE

(71) Applicant: NAMICS CORPORATION, Niigata (JP)

(72) Inventors: Hiroki Myodo, Niigata (JP); Toyokazu Hotchi, Niigata (JP); Masaaki Hoshiyama, Niigata (JP)

(73) Assignee: NAMICS CORPORATION, Niigata (JP)

( * ) Notice: Subject to any disclaimer, the term of this patent is extended or adjusted under 35 U.S.C. 154(b) by 0 days.

(21) Appl. No.: 16/626,467

(22) PCT Filed: Aug. 9, 2018

(86) PCT No.: PCT/JP2018/029949
§ 371 (c)(1),
(2) Date: Dec. 24, 2019

(87) PCT Pub. No.: WO2019/035413
PCT Pub. Date: Feb. 21, 2019

(65) Prior Publication Data
US 2020/0227329 A1 Jul. 16, 2020

(30) Foreign Application Priority Data
Aug. 18, 2017 (JP) .............................. JP2017-158210

(51) Int. Cl.
*H01L 23/495* (2006.01)
*H01L 23/29* (2006.01)
(Continued)

(52) U.S. Cl.
CPC .............. *H01L 23/29* (2013.01); *H01L 23/24* (2013.01); *H01L 23/3121* (2013.01);
(Continued)

(58) Field of Classification Search
CPC . H01L 23/3142; H01L 23/29; H01L 23/4334; H01L 2924/181
(Continued)

(56) References Cited

U.S. PATENT DOCUMENTS 5,107,325 A * 4/1992 Nakayoshi .......... H01L 23/3107
257/793
5,157,478 A * 10/1992 Ueda ...................... H01L 21/565
257/796
(Continued)

FOREIGN PATENT DOCUMENTS

JP  H06-177268 A   6/1994
JP  2002-305266 A  10/2002
(Continued)

OTHER PUBLICATIONS

International Search Report dated Sep. 11, 2018 filed in PCT/JP2018/029949 with English Translation (3 pages).
(Continued)

*Primary Examiner* — Nitin Parekh
(74) *Attorney, Agent, or Firm* — Nakanishi IP Associates, LLC

(57) ABSTRACT

An object of the present invention is to provide a semiconductor device in which peeling between a mold resin and a substrate is suppressed. A semiconductor device 1 includes a semiconductor chip 20 and a substrate 10 that are molded with a mold resin layer 40. The semiconductor device 1 includes a resin layer 50 having a thickness of 200 nm or less different from the mold resin layer 40 between the cured mold resin layer 40 and the substrate 10. The resin layer 50 present between the mold resin layer 40 and the substrate 10 is preferably present on a periphery of 30% or more of the chip when an entire peripheral length of the chip is 100%.

7 Claims, 2 Drawing Sheets

(51) Int. Cl.
  *H01L 23/24* (2006.01)
  *H01L 23/31* (2006.01)
  *H01L 23/433* (2006.01)
  *H01L 23/00* (2006.01)

(52) U.S. Cl.
  CPC ...... *H01L 23/3142* (2013.01); *H01L 23/4334* (2013.01); *H01L 24/73* (2013.01); *H01L 24/743* (2013.01); *H01L 2224/73265* (2013.01); *H01L 2924/181* (2013.01)

(58) Field of Classification Search
  USPC .......................................... 257/783, 790, 778
  See application file for complete search history.

(56) References Cited

U.S. PATENT DOCUMENTS

| | | | | |
|---|---|---|---|---|
| 5,450,283 | A * | 9/1995 | Lin | H01L 21/563 |
| | | | | 174/16.3 |
| 5,900,581 | A * | 5/1999 | Ootake | H01L 23/3121 |
| | | | | 174/523 |
| 6,329,607 | B1 * | 12/2001 | Fjelstad | H01L 23/3107 |
| | | | | 257/688 |
| 6,340,846 | B1 * | 1/2002 | LoBianco | H01L 23/3128 |
| | | | | 257/686 |
| 6,353,263 | B1 * | 3/2002 | Dotta | H01L 21/561 |
| | | | | 257/777 |
| 6,459,163 | B1 * | 10/2002 | Bai | H01L 21/568 |
| | | | | 257/787 |
| 6,621,172 | B2 * | 9/2003 | Nakayama | H01L 23/3121 |
| | | | | 257/787 |
| 6,657,282 | B2 * | 12/2003 | Fukasawa | H01L 21/78 |
| | | | | 257/620 |
| 6,833,612 | B2 * | 12/2004 | Kinsman | H01L 27/14683 |
| | | | | 257/680 |
| 8,610,292 | B2 * | 12/2013 | Chino | H01L 21/561 |
| | | | | 257/788 |
| 8,614,517 | B2 * | 12/2013 | Yasukawa | H01L 23/3128 |
| | | | | 257/E23.129 |
| 8,716,875 | B2 * | 5/2014 | Sutardja | H01L 23/49816 |
| | | | | 257/790 |
| 2005/0275088 | A1 * | 12/2005 | Sakurai | H01L 23/5389 |
| | | | | 257/723 |
| 2006/0055053 | A1 * | 3/2006 | Yamazaki | H01L 23/4985 |
| | | | | 257/778 |
| 2008/0258317 | A1 * | 10/2008 | Ejima | H01L 23/3128 |
| | | | | 257/E23.126 |
| 2017/0200688 | A1 | 7/2017 | Kim et al. | |

FOREIGN PATENT DOCUMENTS

| | | |
|---|---|---|
| JP | 2006-032617 A | 2/2006 |
| JP | 2008-166333 A | 7/2008 |
| JP | 2012-109636 A | 6/2012 |
| JP | 2016-156018 A | 9/2016 |
| TW | 201725685 A | 7/2017 |
| WO | 2014/033768 A1 | 3/2014 |

OTHER PUBLICATIONS

Office Action issued in Japanese Patent Application No. 2017-158210 dated Mar. 2, 2021, with English Translation (8 pages).
"Flip chip" Wikipedia (https://en.wikipedia.org/wiki/Flip_chip#Wire_bonding/thermosonic_bonding) dated Dec. 19, 2021 (5 pages).
"Nikkei X tech" (https://xtech.nikkei.com/dm/article/WORD/20061207/125109/) dated Dec. 7, 1998 (pp. 2).

* cited by examiner

SEMICONDUCTOR DEVICE

TECHNICAL FIELD

The present invention relates to a semiconductor device. The present invention particularly relates to the semiconductor device including a semiconductor chip and a substrate connected in a flip-chip manner.

BACKGROUND ART

In recent years, flip-chip bonding has been used as a semiconductor package mounting method that can address higher density and higher frequency of wiring or the like of electronic equipment. Generally, in the flip-chip bonding, solder bumps formed on the semiconductor chip and solder plated wiring formed on the substrate are soldered. Thereafter, a gap between the semiconductor chip and the substrate is sealed with an insulating resin called an underfill agent.

Usually, in order to increase reliability of the flip-chip bonded semiconductor package, after the semiconductor chip and the substrate are joined together by soldering or the like, the gap between the semiconductor chip and the substrate is filled with the underfill agent which is a thermosetting semiconductor resin sealing composition. Thereafter, a mold resin layer molds a periphery of the semiconductor chip.

As a method for manufacturing the semiconductor device related to a shape of the mold resin layer, the following method for manufacturing the semiconductor device for the purpose of providing the method for manufacturing the semiconductor device having good marking visibility and productivity has been reported (PATENT LITERATURE 1). In this method, the semiconductor chip, a heat sink for radiating heat generated in the semiconductor chip, and a lead for connecting the semiconductor chip and the outside are integrally molded in a resin package. Thus, the semiconductor device is manufactured. This method includes a resin film forming step of forming a resin film on a surface of the heat sink, and a marking step. In the marking step, the resin film is locally removed by heat rays, and the heat sink is locally exposed.

Further, in a double-sided heat dissipation type semiconductor device, the following semiconductor device has been reported for the purpose of preventing current from flowing through an internal circuit due to electrostatic induction due to static electricity (PATENT LITERATURE 2). The semiconductor device includes the semiconductor element, a pair of heat sinks disposed on both sides of the semiconductor element so as to sandwich the semiconductor element, and a mold resin for sealing the semiconductor element and the both heat sinks. The pair of heat sinks is electrically and thermally connected to the semiconductor element. Further, an insulating layer having electrical insulation is provided on an outer surface of each of the both heat sinks. At the same time, the insulating layer is exposed from the mold resin. Then, a conductor layer having conductivity is bonded to a surface exposed from the mold resin of each of the insulating layers. Among them, the conductor layer located on the one heat sink side and the conductor layer located on the other heat sink side are electrically connected through a connecting member having conductivity.

Further, after resin sealing is performed collectively, the semiconductor device in a defective device region where the semiconductor chip is not mounted is unclear. Therefore, in a screening step, all semiconductor devices are screened. As a result, time required for the screening step is increased. That is, manufacturing efficiency of the semiconductor device is reduced. The method for manufacturing the semiconductor device including the following steps for the purpose of solving such a problem has been reported (PATENT LITERATURE 3). The steps include: a step of preparing a multi-piece substrate having a plurality of device regions, and semiconductor chips mounted on the plurality of device regions; a step of mounting the semiconductor chips on the device regions; a step of connecting a surface electrode of the semiconductor chip and a bonding electrode of the device region corresponding to this with the connecting member; a step of detecting a defect in the device region; a step of collectively covering the plurality of device regions in the multi-piece substrate with the mold resin, to resin-seal the semiconductor chip and to form a collective sealing portion; a step of marking a defective mark on a surface of the collective sealing portion of the device region where the defect is detected; and a step of forming individual sealing portions by dividing the multi-piece substrate and the collective sealing portion for each device region along a dicing line and singulating the semiconductor device.

However, the semiconductor device manufactured by the above-described manufacturing method and the above-described semiconductor device may not have sufficient adhesion between the mold resin and the substrate. Therefore, there arises a problem that peeling occurs between the mold resin and the substrate.

CITATION LIST

Patent Literature

PATENT LITERATURE 1: JP-A-06-177268
PATENT LITERATURE 2: JP-A-2008-166333
PATENT LITERATURE 3: JP-A-2002-305266

SUMMARY OF THE INVENTION

Problems to be Solved by the Invention

The present invention addresses the above problems. Specifically, an object of the present invention is to provide the semiconductor device that can suppress peeling between the mold resin and the substrate.

Solution to the Problems

The present inventors have intensively studied to solve the above problems. The semiconductor capable of suppressing peeling between the mold resin and the substrate can be obtained by forming, between the cured mold resin layer and the substrate, a resin layer having a thickness of 200 nm or less different from the mold resin layer.

The present invention relates to the semiconductor device that solves the above problems by having the following configuration.

[1] A semiconductor device includes a semiconductor chip and a substrate that are molded with a mold resin layer. A resin layer having a thickness of 200 nm or less different from the mold resin layer is provided between the cured mold resin layer and the substrate.

[2] In the semiconductor device according to the above-described [1], the resin layer present between the mold resin layer and the substrate is present on a periphery of 30% or more of the semiconductor chip when an entire peripheral length of the semiconductor chip is 100%.

[3] In the semiconductor device according to the above-described [1] or [2], the semiconductor chip is quadrilateral, and the resin layer present between the mold resin layer and the substrate is present on at least two sides of the semiconductor chip.

[4] In the semiconductor device according to any one of the above-described [1] to [3], the resin layer present between the mold resin layer and the substrate contains at least one selected from the group consisting of epoxy resins and acrylic resins.

[5] In the semiconductor device according to any one of the above-described [1] to [4], a surface of the substrate is a solder resist, silicon nitride, polyimide, or silicon.

[6] In the semiconductor device according to any one of the above-described [1] to [5], the semiconductor chip is connected to the substrate in a flip-chip manner.

[7] In the semiconductor device according to the above [6], the semiconductor chip is connected to the substrate in a face-up manner.

[8] In the semiconductor device according to any one of the above [1] to [7], the mold resin layer is an epoxy resin.

Effects of the Invention

According to the present invention [1], it is possible to provide a highly reliable semiconductor device that can suppress peeling between the mold resin and the substrate.

DESCRIPTION OF THE EMBODIMENTS

A semiconductor device of the present invention includes a semiconductor chip and a substrate that are molded with a mold resin layer. Then, the semiconductor device has, between a cured mold resin layer and the substrate, a resin layer having a thickness of 200 nm or less different from the mold resin layer.

Figure 1:
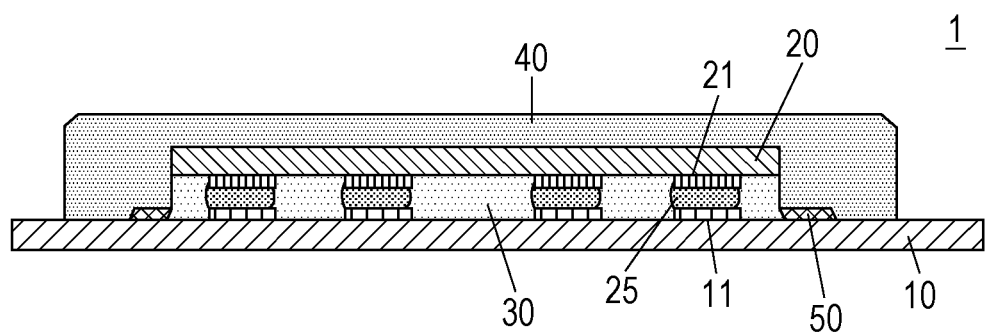
FIG. 1 is an example of a schematic cross-sectional view of a semiconductor device of the present invention.
Figure 2:
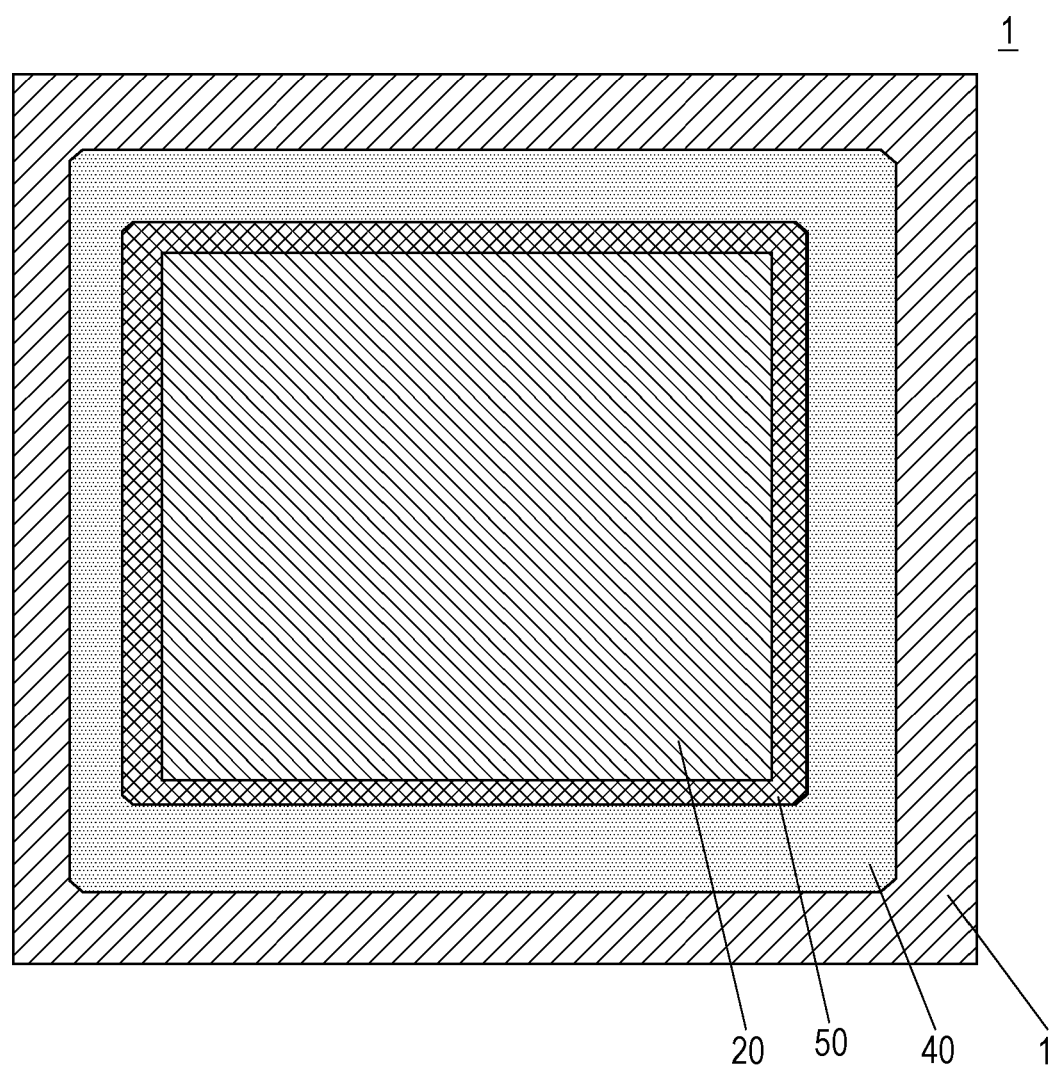
FIG. 2 is an example of a schematic view of an upper surface of the semiconductor device of the present invention.

FIG. 1 shows an example of a schematic cross-sectional view of the semiconductor device of the present invention. Further, FIG. 2 shows an example of a schematic view of an upper surface of the semiconductor device of the present invention. FIG. 2 shows a case where a mold resin layer 40 is transmitting. In FIGS. 1 and 2, a semiconductor device 1 of the present invention is molded with the mold resin layer 40. The semiconductor device 1 includes a semiconductor chip 20 on an upper side thereof and a substrate 10 on a lower side thereof. The semiconductor device 1 further includes a resin layer 50 having a thickness of 200 nm or less different from the mold resin layer 40 between the cured mold resin layer 40 and the substrate 10 and outside the semiconductor chip 20 when viewed from above the semiconductor chip 20. FIG. 1 shows an example in which the semiconductor chip 20 is connected to the substrate 10 in a face-down flip-chip manner. Wiring 21 of the semiconductor chip and wiring 11 of the substrate are connected by a connecting portion 25. Of course, a vertical relationship between the semiconductor chip and the substrate may be reversed. The positional relationship between the semiconductor chip and the substrate is not limited to this example.

Semiconductor Chip

The semiconductor chip is not particularly limited. However, the semiconductor chip that can be connected to the substrate in a flip-chip manner (face-down) or the semiconductor chip that can be connected to the substrate in a face-up manner is more preferable from the viewpoint of easily exerting effects of the present invention.

Substrate

The substrate is not particularly limited. Either of an organic substrate and an inorganic substrate can be used. Examples of the organic substrate include a glass-epoxy substrate epoxy resin and a polyimide resin. Examples of the inorganic substrate include a silicon substrate and a ceramic substrate. Note that a surface of the substrate is preferably a solder resist, silicon nitride, polyimide, or silicon.

Mold Resin Layer

Examples of mold resin (hereinafter referred to as a first resin) include a liquid resin containing an epoxy resin (MA), an acid anhydride curing agent (MB), and an inorganic filler (MC). A component (MA) forms the cured mold resin layer (hereinafter referred to as a first resin layer) of the first resin. The mold resin is preferably a liquid epoxy resin from the viewpoint of reliability.

Curability, heat resistance, and adhesiveness are imparted to the first resin. Durability is imparted to the first resin after curing. Examples of the component (MA) include naphthalene type epoxy resins, aliphatic cyclic epoxy resins, aminophenol type epoxy resins, bisphenol A type epoxy resins, brominated bisphenol A type epoxy resins, bisphenol F type epoxy resins, biphenyl type epoxy resins, novolac type epoxy resins, ether type epoxy resins, polyether type epoxy resins, and oxirane ring-containing epoxy resins. Naphthalene type epoxy resins, aliphatic cyclic epoxy resins, aminophenol type epoxy resins, bisphenol F type epoxy resins, and bisphenol A type epoxy resins are preferable from the viewpoint of glass transition point, reflow resistance, and moisture resistance of the first resin. The component (MA) can be used alone. Or, two or more components (MA) may be used in combination.

A component (MB) has a curing ability of the component (MA). Examples of the component (MB) include tetrahydrophthalic anhydride, hexahydrophthalic anhydride, methyltetrahydrophthalic anhydride, methylhexahydrophthalic anhydride, methylnadic acid anhydride, hydrogenated methylnadic acid anhydride, trialkyltetrahydroanhydride phthalic acid, methylcyclohexene tetracarboxylic dianhydride, phthalic anhydride, trimellitic anhydride, pyromellitic anhydride, benzophenone tetracarboxylic dianhydride, ethylene glycol bis-anhydro trimellitate, glycerin bis(anhydro trimellitate) monoacetate, dodecenyl succinic anhydride, aliphatic dibasic polyanhydride, chlorendic anhydride, methylbutenyl tetrahydrophthalic anhydride, alkylated tetrahydrophthalic anhydride, methyl hymic anhydride, succinic anhydride substituted with an alkenyl group, and glutaric anhydride. Methylbutenyl tetrahydrophthalic anhydride is preferred. Examples of commercially available products include acid anhydrides (grade: YH306, YH307) manufactured by Mitsubishi Chemical Corporation and 3 or 4-methyl-hexahydrophthalic anhydride (product name: HN-5500) manufactured by Hitachi Chemical Co., Ltd. The component (MB) can be used alone. Or, two or more components (MB) may be used in combination.

A thermal expansion coefficient and an elastic modulus of the first resin after curing can be adjusted by a component (MC). Examples of the component (MC) include silica such as colloidal silica, hydrophobic silica, fine silica, and nano silica, acrylic beads, glass beads, urethane beads, bentonite, acetylene black, and Ketjenblack. The component (MC) contains inorganic fillers having at least two average particle sizes (average maximum diameters when not granular) from the viewpoint of viscosity and fluidity of the first resin. Here, the average particle size refers to a median diameter (d50). The phrase "containing the inorganic fillers having at least two average particle sizes" means including at least two or more inorganic fillers having different median diameters (d50). For reasons such as uniform dispersion of the component (MC) and excellent fluidity of the first resin, at least one of the components (MC) preferably contains the inorganic filler having an average particle size of 25 to 100 µm. More preferably, the component (MC) contains at least the inorganic filler having an average particle size of 25 to 100 µm and the inorganic filler having an average particle size of 0.5 to 20 µm. Still more preferably, the component (C) includes at least the inorganic filler having an average particle size of 25 to 100 µm, the inorganic filler having an average particle size of 10 to 20 µm, and the inorganic filler having an average particle size of 0.5 to 7 µm. The average particle size of less than 0.5 µm may increase the viscosity of the first resin and deteriorate the fluidity. When the particle size exceeds 100 µm, it may be difficult to make the component (C) uniformly present in the first resin. Examples of the commercially available products include silica filler (product name: SE-40, average particle size: 50 µm) manufactured by Tokuyama Corporation, silica filler (product name: MSV25G, average particle size: 20 µm) manufactured by Tatsumori Ltd., silica filler (product name: MLV-2114, average particle size: 15 µm) manufactured by Tatsumori Ltd., silica filler (product name: SO-E5, average particle size: 2 µm) manufactured by Admatechs Co., Ltd., and silica (product name: SO-E2, average particle size: 0.5 µm)) manufactured by Admatechs Co., Ltd. Here, the average particle size of the component (C) is measured by a laser scattering/diffraction particle size distribution measuring apparatus (model number: LS13 320) manufactured by Beckman Coulter, Inc. The component (MC) can be used alone. Or, two or more components (MC) may be used in combination.

An acid anhydride equivalent of the component (MB) is preferably 0.6 to 1.1 times an epoxy equivalent of the component (MA). When the acid anhydride equivalent is less than 0.6 times, curing of the component (MA) tends to be insufficient. Or, voids are likely to occur and delamination of the first resin after a reflow test is likely to occur. On the other hand, even when the acid anhydride equivalent of the component (MB) exceeds 1.1 times, the voids and delamination of the first resin after the reflow test are likely to occur.

Content of the component (MC) is preferably 80 to 91 parts by mass with respect to 100 parts by mass of the first resin. When the content is less than 80 parts by mass, warpage of a molded product after curing tends to increase. If the content exceeds 91 parts by mass, the viscosity of the liquid resin composition tends to be too high. Or, the liquid resin composition may not be liquid. Moreover, the content of the inorganic filler having an average particle size of 25 to 100 µm of the component (MC) is preferably 50 to 85 parts by mass with respect to 100 parts by mass of the first resin. The content of the inorganic filler having an average particle size of 0.5 to 20 µm is preferably 5 to 30 parts by mass with respect to 100 parts by mass of the first resin. In the inorganic filler having an average particle size of 0.5 to 20 µm, the contents of the inorganic filler having an average particle size of 10 to 20 µm and the inorganic filler having an average particle size of 0.5 to 7 µm are 0 to 30 parts by mass with respect to 100 parts by mass of the first resin. More preferably, a total content of the inorganic filler having an average particle size of 10 to 20 µm and the inorganic filler having an average particle size of 0.5 to 7 µm is 5 to 30 parts by mass with respect to 100 parts by mass of the first resin.

Examples of an apparatus for mixing the component (MA), the component (MB), and the component (MC) include a planetary mixer and a grinding machine.

The mold resin is applied by a dispenser or the like. The upper surface and a periphery of the semiconductor chip on the substrate are molded. In this way, the mold resin layer is formed.

Resin Layer Different from Mold Resin Layer Present Between Mold Resin Layer and Substrate A resin (hereinafter referred to as a second resin) that forms the resin layer (hereinafter referred to as a second resin layer) which is different from the mold resin layer and present between the mold resin layer and the substrate may be common to an underfill agent. Or, the second resin may be different from the underfill agent. From the viewpoint of ease of forming the mold resin layer, more preferably, the periphery of the semiconductor chip is also formed with the underfill agent. In a case where the periphery of the semiconductor chip is also formed with the underfill agent, its formation method may be a post-feed type or a pre-feed type. Note that when the second resin is different from the underfill agent, the underfill agent which is typically used can be used for the underfill agent.

The second resin includes a thermosetting resin (UA).

The thermosetting resin as a component (UA) is preferably at least one selected from the group consisting of epoxy resins and acrylic resins. The component (UA) containing the epoxy resin is particularly preferred because it can ensure an adhesive force to an adherend. Examples of the epoxy resins include liquid bisphenol A type epoxy resins, liquid bisphenol F type epoxy resins, liquid naphthalene type epoxy resins, liquid hydrogenated bisphenol type epoxy resins, liquid alicyclic epoxy resins, liquid alcohol ether type epoxy resins, liquid cycloaliphatic type epoxy resins, liquid fluorene type epoxy resins, and liquid siloxane-based epoxy resins. The liquid bisphenol A type epoxy resins, the liquid bisphenol F type epoxy resins, the liquid siloxane-based epoxy resins, and aminophenol type epoxy resins are preferred from the viewpoints of curability, heat resistance, adhesiveness, and durability. Moreover, the epoxy equivalent is preferably 80 to 250 g/eq from the viewpoint of viscosity adjustment. Examples of the commercially available products include the bisphenol F type epoxy resin (product name: YDF8170) manufactured by the new Nippon Steel Chemical Co., Ltd., the bisphenol A type epoxy resin (product name: YD8125) manufactured by the new Nippon Steel Chemical Co., Ltd., the naphthalene type epoxy resin (product name: HP4032D) manufactured by DIC Corporation, the siloxane-based epoxy resin (product name: TSL9906) manufactured by Shin-Etsu Chemical Co., Ltd., and the aminophenol type epoxy resin (grade: JER630, JER630LSD) manufactured by Mitsubishi Chemical Corporation. Moreover, a solid epoxy resin may be used. The component (UA) can be used alone. Or, two or more components (UA) may be used in combination.

The acrylic resin as the component (UA) can impart transparency and appropriate hardness to the resin composition after curing. The component (UA) is an acrylic acid ester monomer and/or a methacrylic acid ester monomer, or oligomers thereof. Examples of the acrylic ester monomer and/or the methacrylic ester monomer, or the oligomers thereof that can be used in the present invention include tris(2-hydroxyethyl)isocyanurate diacrylate and/or dimethacrylate, tris(2-hydroxyethyl)isocyanurate triacrylate and/or trimethacrylate, trimethylolpropane triacrylate and/or trimethacrylate and oligomers thereof, pentaerythritol triacrylate and/or trimethacrylate and oligomers thereof, polyacrylate and/or polymethacrylate of dipentaerythritol, tris(acryloxyethyl)isocyanurate, caprolactone-modified tris(acryloxyethyl)isocyanurate, caprolactone-modified tris(methacryloxyethyl)isocyanurate, polyacrylate and/or polymethacrylate of alkyl-modified dipentaerythritol, and polyacrylate and/or polymethacrylate of caprolactone-modified dipentaerythritol. Examples of the commercially available products of the component (UA) include polyester acrylate (product name: EBECRYL810) manufactured by Daicel Ornex Co., Ltd., and polyester acrylate (product name: M7100) manufactured by Toagosei Co., Ltd. The component (UA) can be used alone. Or, two or more components (UA) may be used in combination.

When the component (UA) is the epoxy resin, the second resin contains a curing agent (UB). Examples of component (UB) include an amine-based curing agent, an acid anhydride-based curing agent, and a phenol-based curing agent, and the amine-based curing agent is preferred from the viewpoints of reflow resistance and moisture resistance of the insulating resin composition. The acid anhydride-based curing agent is as described above.

Examples of the amine-based curing agent include modified polyamines including aliphatic polyamines, aromatic amines, polyaminoamides, polyaminoimides, polyaminoesters, polyaminoureas and the like, tertiary amine-based compounds, imidazole-based compounds, hydrazide-based compounds, dicyanamide-based compounds, and melamine-based compounds. Aromatic amine-based compounds are preferred.

The aromatic amine compounds preferably include aromatic amine compounds having one aromatic ring and/or aromatic amine compounds having two aromatic rings.

Examples of the aromatic amine compounds having one aromatic ring include metaphenylenediamine. Examples of the aromatic amine compounds having two aromatic rings include diaminodiphenylmethane and diaminodiphenylsulfone.

As the phenol-based curing agent, for example, a resol type or novolac type phenolic resin can be used. Examples include alkyl resole type, alkyl novolac type, aralkyl novolac type phenolic resins, xylene resins, and allyl phenolic resins. Their number average molecular weight is preferably 220 to 1000, and more preferably 220 to 500. In the case of the alkyl resole type or alkyl novolac type phenolic resins, the resins having an alkyl group having 1 to 18 carbon atoms can be used. The resins having an alkyl group having 2 to 10 carbon atoms such as ethyl, propyl, butyl, pentyl, hexyl, octyl, nonyl, and decyl are preferably used.

The component (UB) can be used alone. Or, two or more components (UB) may be used in combination.

The content of the component (UA) is preferably 5 to 900 parts by mass with respect to 100 parts by mass of the inorganic filler from the viewpoint of reliability.

The content of the component (UB) is preferably 5 to 150 parts by mass with respect to 100 parts by mass of the component UA from the viewpoint of reliability.

The second resin may further contain the following components as necessary.

(1) Latent Curing Agent

A latent curing agent is a compound which is in an inactive state at room temperature and is activated by heating to function as a curing accelerator. Examples include solid dispersion type amine adduct-based latent curing accelerators such as imidazole compounds that are solid at room temperature and reaction products (amine-epoxy adduct-based) of amine compounds and epoxy compounds, and reaction product (urea type adduct-based) of amine compounds and isocyanate compounds or urea compounds. The latent curing agent can be combined with the component (UB) to cure the second resin at low temperature.

(2) Silica Filler

A maximum particle size of the silica filler is preferably 6 μm or less. The silica filler is preferably contained in an amount of 20 to 65 parts by mass with respect to 100 parts by mass of the second resin. Moreover, the silica filler may be surface-treated.

(3) Various Additives

Coupling agent: preferably contains an epoxy group or (meth)acrylate group.

Rheology modifier: can be used to adjust coating suitability and flow suitability.

Dispersant and anti-settling agent: can be used to improve dispersibility and to prevent settling of the filler and colorant.

Antifoaming agent: can be used to adjust antifoaming properties.

Colorant: can be used for coloring.

Surface conditioner: can be used to adjust surface condition and wettability.

Elastomers: can be used to adjust elasticity.

Solid resin: can be used within a range where a liquid state can be maintained as a composition to adjust viscosity, toughness and the like.

As described above, when the periphery of the semiconductor chip is also formed with the underfill agent as the second resin layer, the formation method may be the post-feed type or the pre-feed type. An example of a method for forming the second resin layer is application using the dispenser or the like and subsequent drying.

The thickness of the second resin layer is 200 nm or less. If the thickness of the second resin layer exceeds 200 nm, peeling between the mold resin and the substrate cannot be sufficiently suppressed.

Semiconductor Device

In the semiconductor device of the present invention, the second resin layer is preferably present on an outer periphery of 30% or more of the chip when a length of the entire periphery of the chip is 100%.

The semiconductor chip is quadrilateral, and the resin layer present between the mold resin layer and the substrate is preferably present outside at least two sides and more preferably outside four sides of the semiconductor chip when viewed from above the semiconductor chip, from the viewpoint of suppressing peeling between the mold resin and the substrate.

Moreover, an area of the second resin layer is preferably 0.5 to 50% of an area of the semiconductor chip from the viewpoint of suppressing peeling between the mold resin and the substrate.

Figure 3:
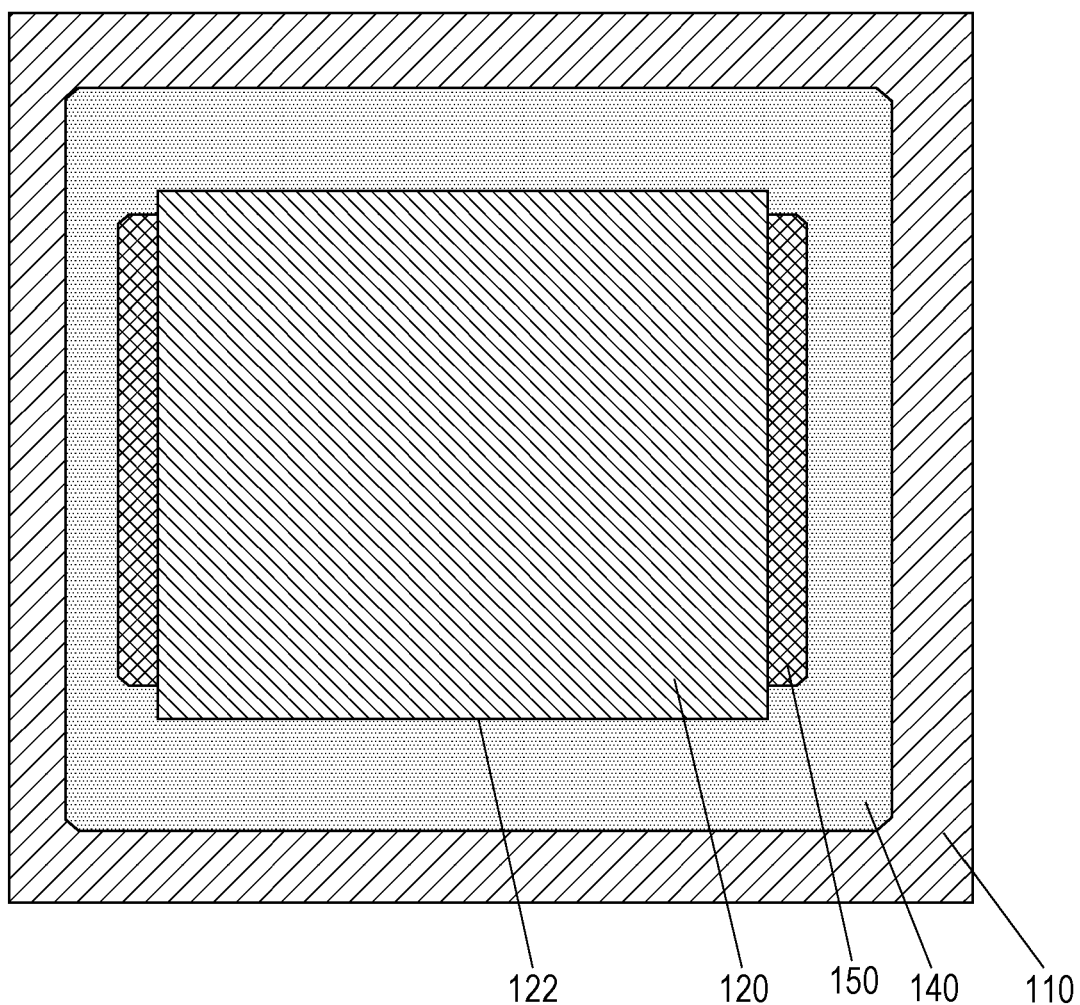
FIG. 3 is an example of the schematic view of the upper surface of the semiconductor device of the present invention.

FIG. 3 shows an example of the schematic view of the upper surface of the semiconductor device of the present invention. FIG. 3 shows the case where the mold resin layer 40 is transmitting. As shown in FIG. 3, in a preferred semiconductor device 100, a second resin layer 150 is present on a periphery (outside the semiconductor chip) of 30% or more when a length of an entire periphery 122 of the chip indicated by a one-dot chain line is 100%. Further, since the semiconductor chip 120 is quadrilateral, the resin layer 150 present between a mold resin layer 140 and a substrate 110 is preferably present outside at least two sides of the semiconductor chip 120 from the viewpoint of suppressing peeling between the mold resin layer 140 and the substrate 110. Moreover, the area of the second resin layer 150 is preferably 0.5 to 50% of the area of the semiconductor chip 1 (7 mm square) from the viewpoint of suppressing peeling between the mold resin layer 140 and the substrate.

The semiconductor device is manufactured by forming the first resin layer after forming the second resin layer.

EXAMPLES

Hereinafter, the present invention will be described with reference to Examples. However, the present invention is not limited to Examples. In the following Examples, "parts" and "%" represent "parts by mass" and "mass %" unless otherwise specified.

As the semiconductor chip described in Tables 1 and 2, the semiconductor chip (product name: CC80-0101JY) manufactured by Walts Co., Ltd. was used. As the substrate, the substrate (described as glass-epoxy in Tables 1 and 2, product name: WALTS-KIT CC80-0102JY) manufactured by Walts Co., Ltd. or the silicon substrate (described as silicon in Tables 1 and 2, length: 10 mm×width: 10 mm×thickness: 725 μm) was used. As a resin layer-containing resin (resin containing a resin layer (second resin layer) having a thickness of 200 nm or less different from the mold resin layer), an epoxy-based sealant (described as epoxy resin in Tables 1 and 2, product name: U8410-73C) manufactured by Namics Corporation or an acrylic sealant (described as an acrylic resin in Tables 1 and 2) manufactured by the following manufacturing method was used.

The acrylic sealant was prepared by kneading with three rolls 50 parts of acrylic resin (product name: A-DCP) manufactured by Shin-Nakamura Chemical Co., Ltd., 50 parts of acrylic resin (product name: ABE-300) manufactured by Shin-Nakamura Chemical Co., Ltd., 1 part of polymerization initiator (product name: Perbutyl P) manufactured by NOF Corporation, and 135 parts of inorganic filler (product name: SO-E2) manufactured by Admatechs Co., Ltd., and then vacuum degassing.

As a molding material, an epoxy-based molding material (described as epoxy-based molding material in Tables 1 and 2, product name: G8345-6) manufactured by Namics Corporation was used.

FU in chip mounting direction indicates face-up. FD indicates face-down.

SR on substrate surface having a thickness of 15 μm was formed by a solder resist (product name: PSR4000-AUS703) manufactured by Taiyo Holdings Co., Ltd. SiN having a thickness of 5 μm was formed of silicon nitride. PI having a thickness of 0.1 μm was formed of polyimide (product name: CRC-6061C) manufactured by Sumitomo Bakelite Co., Ltd.

As an abundance ratio of the resin layer, the abundance ratio of the second resin layer was measured with an industrial microscope (manufactured by Olympus Corporation, model number: STM7).

As the thickness of the resin layer, the thickness of the second resin layer was measured with a scanning electron microscope (SEM, manufactured by Hitachi High-Technologies Corporation) after its cross-section was prepared.

Examples 1 to 10, Comparative Examples 1 and 2

The semiconductor chip and the substrate were assembled, and the resin layer-containing resin was applied thereto. This was left on a hot plate at 50° C. A length of the resin layer was controlled by an elapsed time. Next, this was put in a batch oven, and the resin layer-containing resin was fully cured at 150° C. for 2 hours. In this manner, the device having the resin layer having a thickness of 200 nm or less on the substrate was prepared.

Evaluation of Adhesion

In the device mounted with the semiconductor chip, the fully cured resin layer was applied with the molding material. Thereafter, a cured material of the molding material was prepared by curing the molding material. Thereafter, shear strength between the resin layer and the molding material was measured. The shear strength (unit: MPa) was measured using a desktop strength tester (model number: 1605HTP) manufactured by Aikoh Engineering Co. Ltd.

Evaluation of Reliability

The device mounted with the semiconductor chip was left under an environment of 30° C./60% RH for 168 hours, and then passed through reflow three times. Thereafter, peeling of a molded portion was evaluated using a SAT transmission method. Reflow conditions were based on IPC/JEDEC J-STD-020.

TABLE 1

|  | Example 1 | Example 2 | Example 3 | Example 4 | Example 5 | Example 6 |
|---|---|---|---|---|---|---|
| Resin layer-containing resin | Epoxy resin | Epoxy resin | Epoxy resin | Epoxy resin | Acrylic resin | Epoxy resin |
| Molding material | Epoxy-based molding material | Epoxy-based molding material | Epoxy-based molding material | Epoxy-based molding material | Epoxy-based molding material | Epoxy-based molding material |

TABLE 1-continued

|  | Example 1 | Example 2 | Example 3 | Example 4 | Example 5 | Example 6 |
|---|---|---|---|---|---|---|
| Chip mounting direction | FD | FD | FD | FD | FD | FD |
| Substrate | Glass-epoxy | Glass-epoxy | Glass-epoxy | Glass-epoxy | Glass-epoxy | Glass-epoxy |
| Substrate surface | SR | SR | SR | SR | SR | SR |
| Resin layer variable | 4 | 4 | 4 | 4 | 4 | 4 |
| Resin layer abundance ratio (unit: %) | 40 | 30 | 35 | 30 | 30 | 30 |
| Resin layer thickness (unit: nm) | 200 | 10 | 85 | 92 | 91 | 92 |
| Adhesion (unit: MPa) | 74 | 68 | 72 | 73 | 65 | 70 |
| Reliability | 7/7 | 7/7 | 7/7 | 7/7 | 7/7 | 7/7 |

TABLE 2

|  | Example 7 | Example 8 | Example 9 | Example 10 | Comparative Example 1 | Comparative Example 2 |
|---|---|---|---|---|---|---|
| Resin layer-containing resin | Epoxy resin | Epoxy resin | Epoxy resin | Epoxy resin | Epoxy resin | Epoxy resin |
| Molding material | Epoxy-based molding material | Epoxy-based molding material | Epoxy-based molding material | Epoxy-based molding material | Epoxy-based molding material | Epoxy-based molding material |
| Chip mounting direction | FD | FD | FU | FD | FD | FD |
| Substrate | Silicon | Silicon | Glass-epoxy | Glass-epoxy | Glass-epoxy | Glass-epoxy |
| Substrate surface | SiN | PI | SR | SR | SR | SR |
| Resin layer variable | 4 | 4 | 4 | 2 | 0 | 4 |
| Resin layer abundance ratio (unit: %) | 30 | 30 | 30 | 30 | 0 | 55 |
| Resin layer thickness (unit: nm) | 87 | 87 | 91 | 90 | 0 | 250 |
| Adhesion (unit: MPa) | 72 | 71 | 71 | 72 | 54 | 72 |
| Reliability | 7/7 | 7/7 | 7/7 | 7/7 | 0/7 | 2/7 |

As can be seen from Tables 1-2, in all of Examples 1-10, the adhesion and reliability were good. In contrast, in Comparative Example 1 without the second resin layer and Comparative Example 2 in which the second resin layer was too thick, the reliability was poor.

INDUSTRIAL APPLICABILITY

The present invention is very useful because it can provide the semiconductor device that can suppress peeling between the mold resin and the substrate.

LIST OF REFERENCE NUMERALS 1, 100 Semiconductor device
10, 110 Substrate
11 Wiring of substrate
20, 120 Semiconductor chip
21 Wiring of semiconductor chip
122 Entire periphery of semiconductor chip
25 Connecting portion
30 Underfill agent
40, 140 Mold resin layer
50, 150 Resin layer having thickness of 200 nm or less different from mold resin layer

The invention claimed is:
1. A semiconductor device comprising a semiconductor chip and a substrate that are molded with a mold resin layer, wherein:
   the semiconductor chip is connected to the substrate in a flip-chip manner,
   such that a conductive wire of the semiconductor chip is disposed on the semiconductor chip and a conductive wire of the substrate is disposed on the substrate, a surface of the semiconductor chip disposed on the conductive wire of the semiconductor chip and a surface of the substrate disposed on the conductive wire of the substrate face each other, the conductive wire of the semiconductor chip and the conductive wire of the substrate are connected by a conductive connecting member disposed on the conductive wire of the semiconductor chip, a resin layer having a thickness of 200 nm or less different from the mold resin layer is provided between the mold resin layer and the substrate;

the resin layer different from the mold resin layer exists only at a place outside the semiconductor chip viewed from a top of the semiconductor device;

the resin layer different from the mold resin layer does not abut on the semiconductor chip; and a bottom surface of the resin layer different from the mold resin layer abuts on a top surface of the substrate.

2. The semiconductor device according to claim 1, wherein the resin layer present between the mold resin layer and the substrate is present on a periphery of 30% or more of the semiconductor chip when an entire peripheral length of the semiconductor chip is 100%.

3. The semiconductor device according to claim 1, wherein the semiconductor chip is quadrilateral, and the resin layer present between the mold resin layer and the substrate is present on at least two sides of the semiconductor chip.

4. The semiconductor device according to claim 1, wherein the resin layer present between the mold resin layer and the substrate contains at least one selected from the group consisting of epoxy resins and acrylic resins.

5. The semiconductor device according to claim 1, wherein a surface of the substrate is a solder resist, silicon nitride, polyimide, or silicon.

6. The semiconductor device according to claim 1, wherein the mold resin layer is an epoxy resin.

7. A semiconductor device comprising a semiconductor chip and a substrate that are molded with a mold resin layer, wherein the semiconductor chip is connected to the substrate in a flip-chip manner, such that a conductive wire of the semiconductor chip is disposed on the semiconductor chip and a conductive wire of the substrate is disposed on the substrate, a surface of the semiconductor chip disposed on the conductive wire of the semiconductor chip and a surface of the substrate disposed on the conductive wire of the substrate face each other, the conductive wire of the semiconductor chip and the conductive wire of the substrate are connected by a conductive connecting member disposed on the conductive wire of the semiconductor chip, a resin layer having a thickness of 200 nm or less different from the mold resin layer is provided between the mold resin layer and the substrate, except for an entire area in which the semiconductor chip overlaps a substrate viewed from a top of the semiconductor device;

the resin layer different from the mold resin layer does not abut on the semiconductor chip; and a bottom surface of the resin layer different from the mold resin layer abuts on a top surface of the substrate.

* * * * *